US010468200B2

(12) United States Patent
Morita et al.

(10) Patent No.: US 10,468,200 B2
(45) Date of Patent: Nov. 5, 2019

(54) POWER SUPPLY DEVICE

(71) Applicants: AUTONETWORKS TECHNOLOGIES, LTD., Yokkaichi-shi, Mie (JP); SUMITOMO WIRING SYSTEMS, LTD., Yokkaichi-shi, Mie (JP); SUMITOMO ELECTRIC INDUSTRIES, LTD., Osaka-shi, Osaka (JP)

(72) Inventors: Kyohei Morita, Yokkaichi (JP); Tatsuya Sumida, Yokkaichi (JP)

(73) Assignees: AUTONETWORKS TECHNOLOGIES, LTD., Mie (JP); SUMITOMO WIRING SYSTEMS, LIMITED, Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/085,325

(22) PCT Filed: Mar. 13, 2017

(86) PCT No.: PCT/JP2017/009871
§ 371 (c)(1),
(2) Date: Sep. 14, 2018

(87) PCT Pub. No.: WO2017/169678
PCT Pub. Date: Oct. 5, 2017

(65) Prior Publication Data
US 2019/0108949 A1      Apr. 11, 2019

(30) Foreign Application Priority Data
Mar. 29, 2016   (JP) .................. 2016-066019

(51) Int. Cl.
*H05K 1/14* (2006.01)
*H05K 5/02* (2006.01)
(Continued)

(52) U.S. Cl.
CPC ............... *H01G 11/10* (2013.01); *H01G 2/06* (2013.01); *H01G 11/76* (2013.01); *H01G 11/78* (2013.01);
(Continued)

(58) Field of Classification Search
CPC .. H05K 1/14; H05K 5/02; H05K 5/04; H05K 7/20; H01G 4/38; H01R 12/14
(Continued)

(56) References Cited

U.S. PATENT DOCUMENTS 3,622,919 A  *  11/1971  Wilhoit .................. H01H 19/56
                                                                333/81 A
5,018,050 A  *   5/1991  Maenishi ............. H05K 5/0247
                                                                335/202
(Continued)

FOREIGN PATENT DOCUMENTS

JP     2011-216858 A    10/2011
JP     2012-178271 A     9/2012
(Continued)

OTHER PUBLICATIONS

Jun. 6, 2017 International Search Report issued in International Patent Application PCT/JP2017/009871.

*Primary Examiner* — Xiaoliang Chen
(74) *Attorney, Agent, or Firm* — Oliff PLC

(57) ABSTRACT

A power supply device that includes a plurality of capacitors including a plurality of lead terminals; a circuit board including a conductive path; a relay terminal configured to connect the lead terminals to the conductive path of the circuit board; and a cover configured to cover the plurality
(Continued)

of lead terminals of the plurality of capacitors, wherein the plurality of capacitors are oriented such that the respective lead terminals are disposed on an inner side, and the relay terminal includes a plurality of pressure contacts configured to come into pressure contact with a plurality of lead terminals of the plurality of capacitors, the lead terminals having the same potential, and a board connector configured to be connected to the conductive path of the circuit board, a number of the board connector being smaller than a number of the plurality of pressure contacts.

1 Claim, 15 Drawing Sheets

(51) Int. Cl.
*H05K 5/04* (2006.01)
*H05K 7/20* (2006.01)
*H01G 4/38* (2006.01)
*H01G 11/10* (2013.01)
*H01G 11/76* (2013.01)
*H01G 2/06* (2006.01)
*H01G 11/78* (2013.01)
*H05K 1/18* (2006.01)
*H01G 11/82* (2013.01)
*B60L 50/40* (2019.01)
*B60K 6/28* (2007.10)
*B60R 16/033* (2006.01)

(52) U.S. Cl.
CPC ............ *H01G 11/82* (2013.01); *H05K 1/181* (2013.01); *B60K 6/28* (2013.01); *B60L 50/40* (2019.02); *B60R 16/033* (2013.01); *B60Y 2200/91* (2013.01); *B60Y 2200/92* (2013.01); *B60Y 2400/11* (2013.01); *H05K 2201/10015* (2013.01); *H05K 2201/10522* (2013.01)

(58) Field of Classification Search
USPC ........ 174/260, 359, 377; 361/328, 690, 717; 324/426
See application file for complete search history.

(56) References Cited

U.S. PATENT DOCUMENTS

| | | | |
|---|---|---|---|
| 6,078,155 A * | 6/2000 | Tominaga | B62D 5/0406 318/293 |
| 6,560,778 B1 * | 5/2003 | Hasegawa | H05K 9/0007 174/359 |
| 2004/0113740 A1 * | 6/2004 | Sakai | H01F 5/04 336/208 |
| 2006/0061937 A1 * | 3/2006 | Takemoto | B60R 16/023 361/328 |
| 2008/0139017 A1 * | 6/2008 | Kiyofuji | G01R 1/07371 439/75 |
| 2010/0055993 A1 | 3/2010 | Ikeda et al. | |
| 2010/0188800 A1 | 7/2010 | Ashizaki et al. | |
| 2011/0045329 A1 | 2/2011 | Ikeda et al. | |
| 2011/0248719 A1 * | 10/2011 | Aoki | H01M 10/482 324/426 |
| 2012/0009447 A1 | 1/2012 | Ikeda et al. | |
| 2015/0228945 A1 | 8/2015 | Maruoka | |

FOREIGN PATENT DOCUMENTS

| | | |
|---|---|---|
| JP | 2013-98206 A | 5/2013 |
| JP | 2014-157742 A | 8/2014 |

* cited by examiner

POWER SUPPLY DEVICE

This application is the U.S. National Phase of PCT/JP2017/009871 filed Mar. 13, 2017, which claims priority to JP 2016-066019 filed Mar. 29, 2016, the entire disclosure of which is incorporated herein by reference.

BACKGROUND

A technique relating to a power supply device including a capacitor is disclosed herein.

Conventionally, vehicles such as automobiles including a capacitor as an auxiliary power supply separate from a battery serving as the main power supply are known. The capacitor module disclosed in JP 2013-98206A includes six capacitors disposed in parallel, and a pair of lead wires of each of the capacitors are bent in an L-shape. Each of the lead wires of the six capacitors is passed through a through hole of a wiring board, and is soldered to a wiring board. Consequently, the six capacitors are connected in series via the wires of the wiring board.

SUMMARY

Meanwhile, for the capacitor module of the JP 2013-98206A, the lead wires of the six capacitors are passed through the respective corresponding through holes and soldered. Accordingly, the soldering operation needs to be performed for the number of times corresponding to the number of lead wires, resulting in the problem that it takes time and effort to connect the lead wires to the conductive path of a circuit board.

An exemplary aspect of the disclosure simplifies the operation of electrically connecting the lead terminals of capacitors and the conductive path of a circuit board.

A power supply device described herein includes: a plurality of capacitors including a plurality of lead terminals; a circuit board including a conductive path; and a relay terminal configured to connect the lead terminals to the conductive path of the circuit board, wherein the relay terminal includes a plurality of pressure contacts configured to come into pressure contact with a plurality of lead terminals of the plurality of capacitors, the lead terminals having the same potential, and a board connector configured to be connected to the conductive path of the circuit board, the number of the board connector being smaller than the number of the plurality of pressure contacts.

With the present configuration, the plurality of lead terminals of the plurality of capacitors that have the same potential are brought into pressure contact with the plurality of pressure contacts, and the number of board connector that is smaller than the number of the plurality of pressure contacts are connected to the conductive path of the circuit board. Accordingly, the number of locations where the conductive path of the circuit board is connected to the board connector can be made smaller than the number of lead terminals. This makes it possible to simplify the operation of electrically connecting the lead terminals of the capacitors to the conductive path of the circuit board, as compared with a configuration in which the plurality of lead terminals are separately connected to the conductive path of the circuit board. Note that the plurality of lead terminals having the same potential can include a case where the plurality of lead terminals have substantially the same voltage, and the plurality of lead terminals having substantially the same voltage can include a case where, for example, there is a voltage difference due to an error between the plurality of lead terminals.

The following embodiments are preferable as embodiments of the technique described herein.

The circuit board includes the conductive path on a surface thereof, and the board connector is connected to the conductive path on the surface of the circuit board.

When reflow soldering is performed to electrically connect the lead terminals of the capacitors to the surface of the circuit board, there is a concern that the capacitors may be affected by heat during heating when passed through a reflow furnace. With the present configuration, the capacitors can be attached after reflow soldering the relay terminals to the conductive path of the circuit board, for example. Accordingly, even in the case of performing surface mounting, it is possible to prevent the capacitors from being affected by heat during reflow soldering.

The power supply device includes a plurality of the relay terminals, and a resin holder configured to hold the plurality of relay terminals.

This allows the plurality of relay terminals to be held by the holder, thus making it possible to easily assemble the plurality of relay terminals.

The relay terminal includes the plurality of pressure contacts configured to come into pressure contact with the plurality of lead terminals of a plurality of the capacitors that are configured to be connected in series, and the plurality of pressure contacts configured to come into pressure contact with the plurality of lead terminals of a plurality of the capacitors that are configured to be connected in parallel.

This makes it possible to further reduce the number of connections between the conductive path of the circuit board and the board connection.

The power supply device includes a cover configured to cover the lead terminals, wherein a viewing hole that allows the pressure contact to be viewed from outside is formed extending through the cover.

In doing so, the state of connection between the lead terminals and the pressure contacts can be checked from the viewing hole.

According to the technique described herein, it is possible to simplify the operation of electrically connecting lead terminals of capacitors to a conductive path of a circuit board.

DETAILED DESCRIPTION OF EMBODIMENTS

Embodiment 1

Embodiment 1 will be described with reference to FIGS. 1 to 7.

An auxiliary power supply device 10 (an example of "power supply device") according to the present embodiment can be mounted to a vehicle such as an electric car or a hybrid car, separately from a battery serving as a main power supply and can supply power to a load (a motor, a lamp, or the like) if a failure occurs in the main power supply, or can supply power during an idling stop, for example.

Auxiliary Power Supply Device 10

Figure 3:
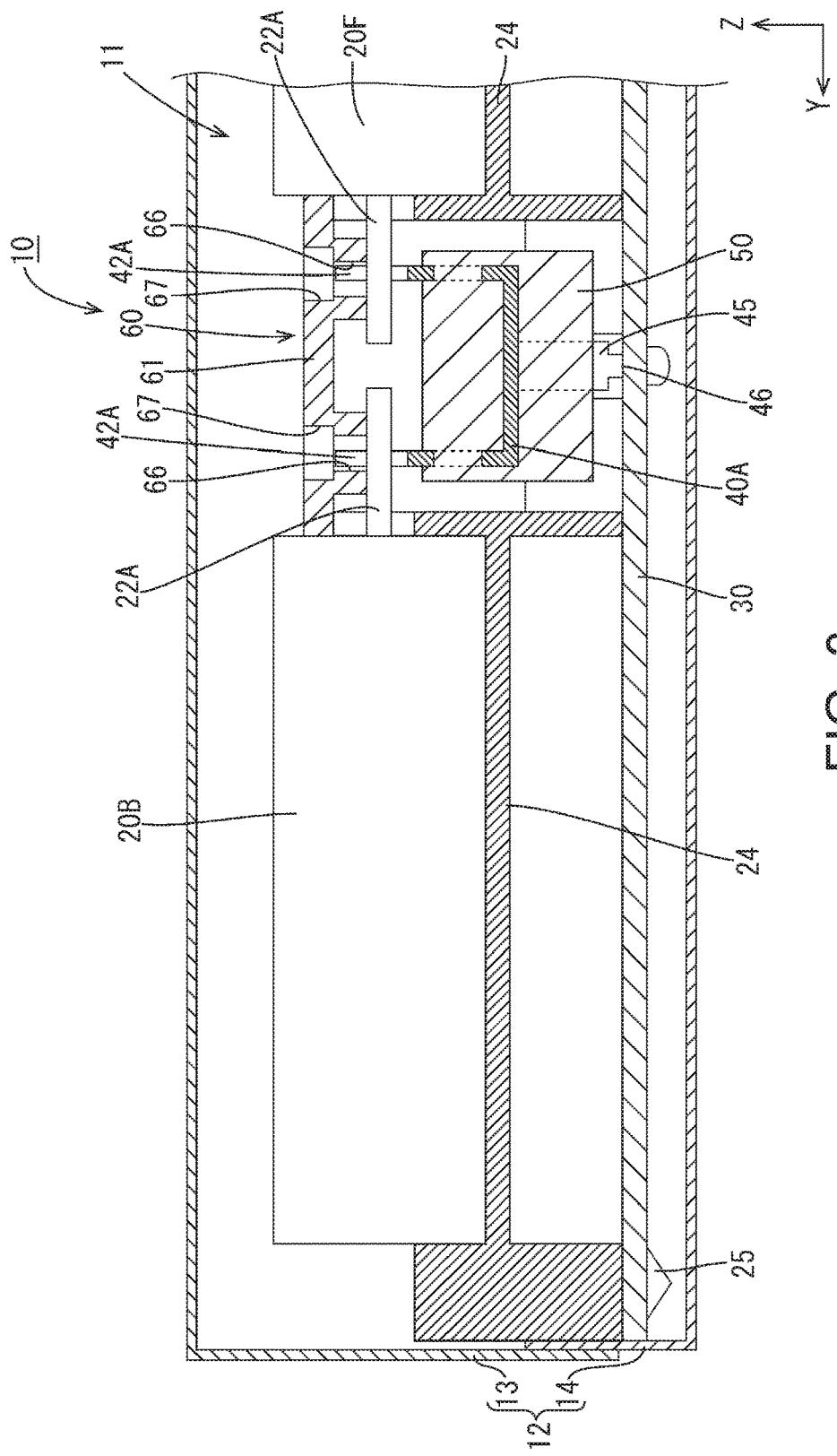
FIG. 3 is a YZ plane cross-sectional view of the auxiliary power supply device.

As shown in FIG. 3, the auxiliary power supply device 10 houses an auxiliary power supply body 11 in an exterior case 12. The exterior case 12 is made of a synthetic resin or a metal, and is formed by fitting an upper case 13 and a lower case 14 to each other.

Auxiliary Power Supply Body 11

Figure 1:
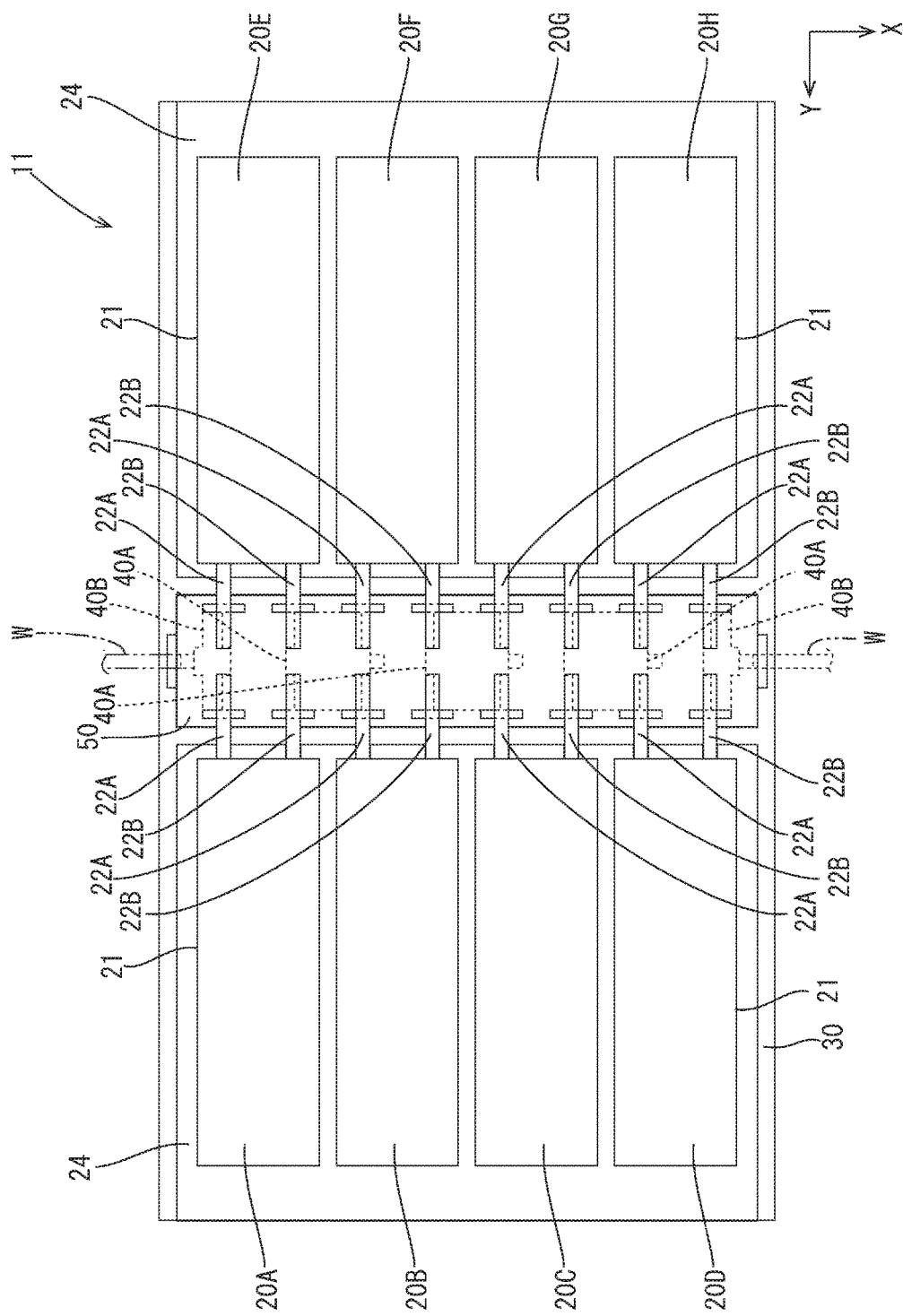
FIG. 1 is a plan view showing an auxiliary power supply body of an auxiliary power supply device according to Embodiment 1.

As shown in FIG. 1, the auxiliary power supply body 11 includes a plurality of (eight in the present embodiment) capacitors 20A to 20H each including a pair of lead terminals 22A and 22B, a circuit board 30, a plurality of (five in the present embodiment) relay terminals 40A and 40B that connect the lead terminals 22A and 22B of the capacitors 20A to 20H to a conductive path of the circuit board 30, and a holder 50 that holds the relay terminals 40A and 40B.

Capacitors 20A to 20H

As the capacitors 20A to 20H, a capacitor having a relatively large capacitance, such as an electric double layer capacitor or a lithium ion capacitor is used, and each of the capacitors 20A to 20H includes a columnar electricity storage body 21 in which an electricity storage element is housed, and a pair of lead terminals 22A and 22B (the positive electrode is denoted as 22A, and the negative electrode is denoted as 22B) that are linearly guided from an end face of the electricity storage body 21. The lead terminals 22A and 22B are elongated columnar pieces of metal, and linearly extend in the left-right direction (the axial direction of the electricity storage body 21).

The plurality of electricity storage bodies 21 are held by a pair of left and right capacitor holders 24 made of a synthetic resin. The capacitor holders 24 hold the plurality of electricity storage bodies 21 of the capacitors 20A to 20H arranged front to rear, and include a plurality of recessed surfaces that are curved into a circular arc shape so as to come into close contact with side surfaces of the electricity storage bodies 21. Each capacitor holder 24 is fixed onto the circuit board 30 by a locking piece 25 locking to the circuit board 30. The capacitors 20A to 20H held by the capacitor holders 24 are disposed so as to be arranged front to rear and left to right in a horizontal orientation (orientation in which the axial direction coincides with the left-right direction), and the left and right capacitors 20A to 20H are oriented such that the respective lead terminals 22A and 22B are disposed on the inner side.

Figure 2:
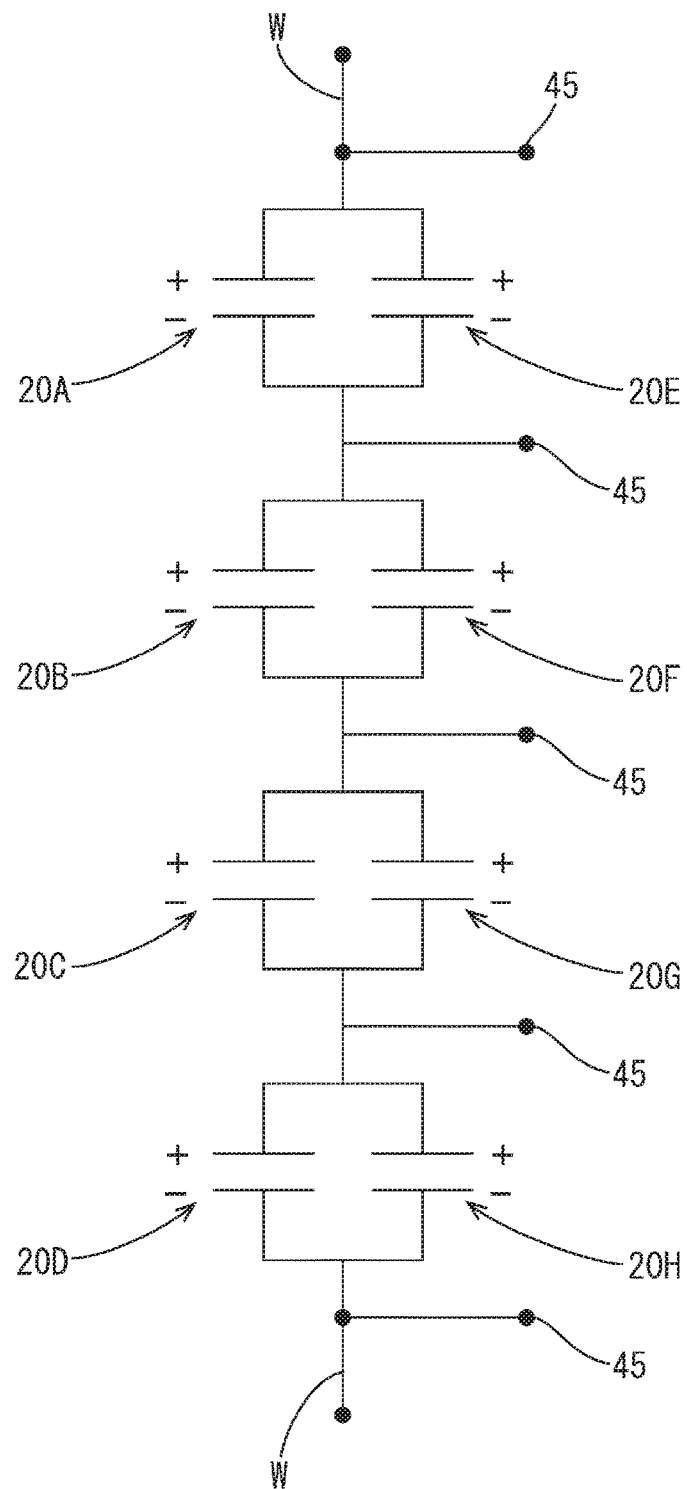
FIG. 2 is a diagram illustrating electrical connection of a plurality of capacitors.

The plurality of capacitors 20A to 20H are arranged in the front-rear direction such that adjacent lead terminals 22A and 22B have opposite polarities, and are arranged in the left-right direction such that laterally opposing lead terminals 22A and 22B have the same polarity. Consequently, as shown in FIG. 2, the capacitors 20A to 20H that are arranged front to rear are connected in series via the relay terminals 40A and 40B, and the capacitors 20A to 20H that are arranged left to right are connected in parallel via the relay terminals 40A and 40B. Accordingly, the capacitors 20A to 20H as a whole are connected in series-parallel.

Circuit Board 30

Figure 4:
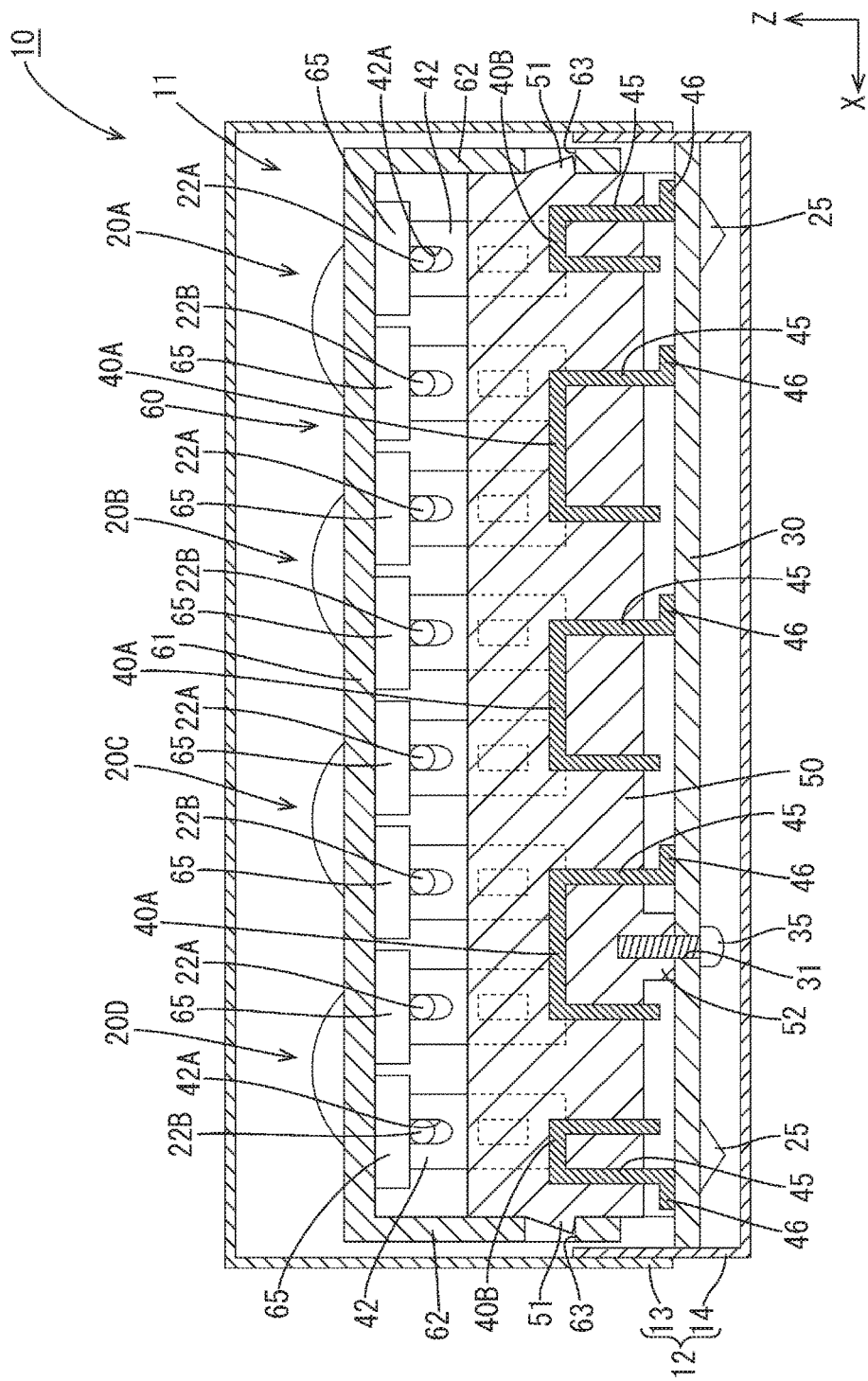
FIG. 4 is an XZ plane cross-sectional view of the auxiliary power supply device.

The circuit board 30 is a printed circuit board in which a conductive path made of a copper foil is printed on an insulating plate. As shown in FIG. 4, a screw hole 31 is formed extending through the circuit board 30 for screwing to the holder 50 using a screw 35.

Relay Terminals 40A and 40B

Figure 5:
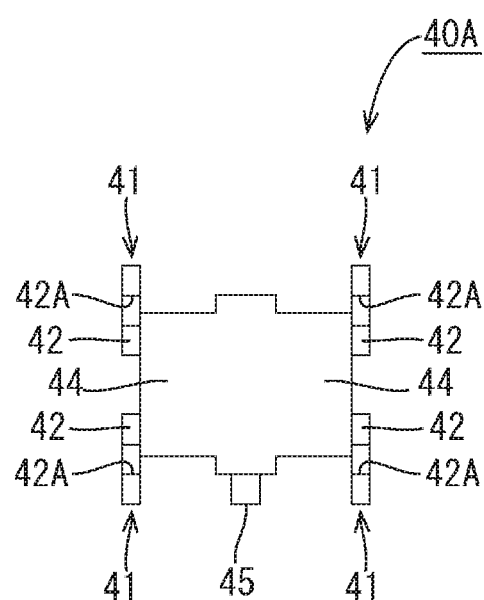
FIG. 5 is a plan view showing a relay terminal.
Figure 6:
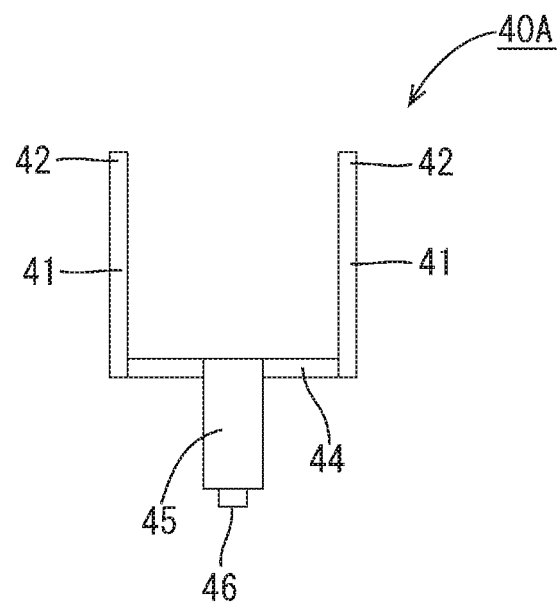
FIG. 6 is a front view showing the relay terminal.
Figure 7:
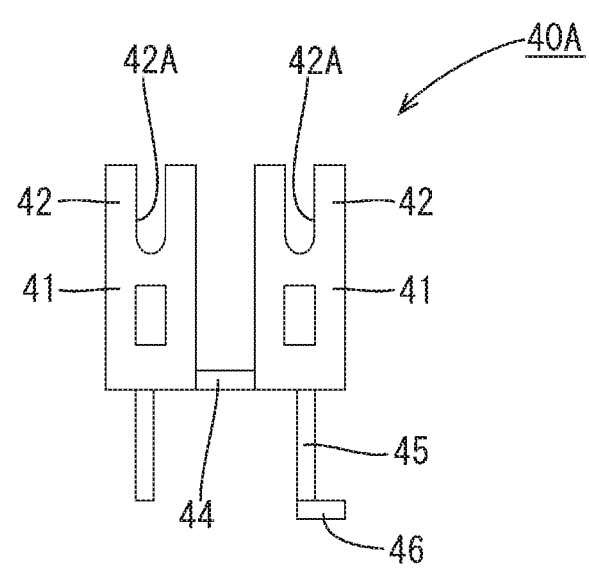
FIG. 7 is a side view showing the relay terminal.

The plurality of relay terminals 40A and 40B include relay terminals 40A that connect the capacitors 20A to 20H in series parallel, and relay terminals 40B that are provided at serial connection ends so as to connect the capacitors 20A to 20H in parallel. As shown in FIGS. 5 to 7, each relay terminal 40A includes four (a plurality of) plate-shaped connection pieces 41, a rectangular, plate-shaped coupling portion 44 that couples the four connection pieces 41, and one board connection portion 45 extending in a rod shape on the opposite side of the connection pieces 41 relative to the coupling portion 44. These components are formed integrally.

The connection pieces 41 are connected to each other at four corner positions of the coupling portion 44, and each include a U-shaped pressure contact portion 42 at a distal end thereof. A clamping groove 42A cut out in a slit shape is formed in each pressure contact portion 42. When the lead terminals 22A and 22B have been inserted into a clamping groove 42A, opposite sides of the lead terminals 22A and 22B are clamped by the groove wall of the clamping groove 42A, thereby electrically connecting the lead terminals 22A and 22B to the relay terminals 40A and 40B. A pressure contact portion 42 of a relay terminal 40A comes into pressure contact with a lead terminal 22A (or the lead terminal 22B), which is one of four lead terminals that have the same potential, of the capacitors 20A to 20H.

Each board connection portion 45 extends in a direction orthogonal to a surface of the coupling portion 44 from an edge of the coupling portion 44, and includes, at its distal end, a contact portion 46 that is bent in an L-shape. The contact portion 46 can be connected to the conductive path on the surface of the board through reflow soldering, for example.

Each relay terminal 40B is configured to be connected to a terminal at an end portion of a wire W that can be connected to an external device or the like. Unlike the relay terminal 40A, the relay terminal 40B includes a pair of pressure contact portions 42 configured to connect the lead terminals 22A and 22B in parallel, and pressure contact portions 42 that connect the lead terminals 22A and 22B in series are not provided.

Holder 50

The holder 50 is made of an insulating synthetic resin, and, as shown in FIG. 4, holds a plurality of relay terminals 40A and 40B, and includes a boss portion 52 that can be screwed with a screw 35, from below the circuit board 30. The relative position between adjacent relay terminals 40A and 40B is held by the holder 50. The holding structure of the holder 50 holding the relay terminals 40A and 40B can be any of various structures, including, for example, a structure in which the relay terminals 40A and 40B are fixed to the holder 50 through insert molding, a configuration in which the relay terminals 40A and 40B are fitted into clearances provided inside the holder 50, and a structure in which a holder 50 with press fitting holes formed therein is used, and the relay terminals 40A and 40B are pressed into the press fitting holes. Although the holder 50 is formed separately from the capacitor holders 24 in the present embodiment, the holder 50 may be formed integrally with the capacitor holders 24.

The upper side of the lead terminals 22A and 22B and the relay terminals 40A and 40B is covered by a cover 60 made of an insulating synthetic resin. The cover 60 is placed, for example, on upper end edges of the capacitor holders 24, and includes a plate-shaped cover body 61, side wall portions 62 protruding downward from front and rear ends of the cover body 61, and tibular tube portions 65 protruding downward at positions of the cover body 61 that correspond to the pressure contact portions 42.

Each side wall portion 62 includes a locked portion 63 that is locked to a locking portion 51 of the holder 50 so as to inhibit the removal of the cover 60 from the holder 50. The locked portion 63 extends through the side wall portion 62 and forms a rectangular shape. The locking portion 51 has an inclined surface protruding in a step-like shape from a side surface of the holder 50, and has a protruding dimension that decreases toward the upper side.

As shown in FIG. 3, each tube portion 65 has an insertion hole 66 into which the pressure contact portion 42 can be inserted. With the cover 60 being attached above the lead terminals 22A and 22B, each pressure contact portion 42 is surrounded by a tube portion 65. A viewing hole 67 is in communication with an area above the insertion hole 66 of the cover body 61. The state in which the lead terminals 22A and 22B are brought into pressure contact with a pressure contact portion 42 can be viewed through the viewing hole 67 from above the cover 60.

A method for assembling the auxiliary power supply device 10 will be described.

A holder 50 in which a plurality of relay terminals 40A and 40B are held is screwed to a circuit board 30 by using a screw 35, and contact portions 46 of board connection portions 45 are soldered to a conductive path of the circuit board 30 through reflow soldering.

Next, capacitor holders 24 are attached and fixed to the circuit board 30. Next, capacitors 20A to 20H are accommodated in recessed surfaces of the capacitor holders 24, and lead terminals 22A and 22B are brought into pressure contact with clamping grooves 42A of the respective pressure contact portions 42. Next, a cover 60 is disposed on the upper side of the pressure contact portions 42, and is attached to the holder 50. Thus, an auxiliary power supply body 11 is formed. And by attaching an upper case 13 and a lower case 14 so as to accommodate the auxiliary power supply body 11, an auxiliary power supply device 10 is formed.

According to the present embodiment, the following actions and effects can be achieved.

An auxiliary power supply device 10 includes: a plurality of capacitors 20A to 20H including a plurality of lead terminals 22A and 22B; a circuit board 30 including a conductive path; and relay terminals 40A 4013 that connect the lead terminals 22A and 22B to the conductive path of the circuit board 30, wherein the relay terminal 40A and 40B includes a plurality of pressure contact portions 42 configured to come into pressure contact with a plurality of lead terminals 22A and 22B of the plurality of capacitors 20A to 20H, the lead terminals 22A and 22B having the same potential, and a board connection portion 45 that is connected to the conductive path of the circuit board 30, the number of board connection portions 45 being smaller than the number of the plurality of pressure contact portions 42.

According to the present embodiment, the auxiliary power supply device 10 includes the plurality of pressure contact portions 42 that come into pressure contact with the plurality of lead terminals 22A and 22B of the plurality of capacitors 20A to 20H, the lead terminals 22A and 22B having the same potential, and fewer board connection portions 45 than the number of the plurality of pressure contact portions 42 are connected to the conductive path of the circuit board 30. Accordingly, the number of connections between the conductive path of the circuit board 30 and the board connection portions 45 can be made smaller than the number of lead terminals 22A and 22B. This makes it possible to simplify the operation of electrically connecting the lead terminals 22A and 22B to the conductive path of the circuit board 30, as compared with a configuration in which the plurality of lead terminals 22A and 22B are separately connected to the conductive path of the circuit board 30. Note that the plurality of lead terminals 22A and 22B having the same potential include a case where the plurality of lead terminals 22A and 22B have substantially the same voltage. The voltage being substantially the same includes a case where there is a potential difference due to an error, and a potential difference due to a difference in resistance between the lead terminals 22A and 22B.

The circuit board 30 includes a conductive path on a surface thereof, and the board connection portions 45 are connected to the conductive path on the surface of the circuit board 30.

When reflow soldering is performed to electrically connect the lead terminals 22A and 22B of the capacitors 20A to 20H to the surface of the circuit board 30, there is a concern that the capacitors 20A to 20H may be affected by heat during heating when passed through a reflow furnace. According to the present embodiment, even when the board connection portions 45 are soldered to the conductive path on the surface of the circuit board 30 through reflow soldering, after reflow soldering has been performed on the relay terminals 40A and 40B, the lead terminals 22A and 22B can be brought into pressure contact with the pressure contact portions 42 so as to be attached to the capacitors 20A to 20H. Accordingly, it is possible to prevent the capacitors 20A to 20H from being affected by heat, thus increasing the degree of freedom of assembly of the auxiliary power supply device 10.

The auxiliary power supply device 10 includes a plurality of the relay terminals 40A and 40B, and a resin holder 50 configured to hold the plurality of relay terminals 40A and 40B.

This allows the plurality of relay terminals 40A and 4013 to be held by the holder 50, thus making it possible to easily assemble the plurality of relay terminals 40A and 40B.

The relay terminals 40A and 40B include the plurality of pressure contact portions 42 that come into pressure contact with the plurality of lead terminals 22A and 22B of a plurality of capacitors 20A to 20H that are to be connected in series, and the plurality of pressure contact portions 42 that come into pressure contact with the plurality of lead terminals 22A and 22B of a plurality of capacitors 20A to 20H that are to be connected in parallel.

This allows four lead terminals 22A and 22B to be connected to the circuit board 30 by using a single board connection portion 45, thus making it possible to further reduce the number of connections between the conductive path of the circuit board 30 and the board connection portion 45.

The auxiliary power supply device 10 includes a cover 60 that covers the lead terminals 22A and 22B, wherein viewing holes 67 that allow the pressure contact portions 42 to be viewed from outside are formed extending through the cover 60.

In doing so, the state of connection between the lead terminals 22A and 22B and the pressure contact portions 42 can be checked from the viewing holes 67.

Embodiment 2

Figure 8:
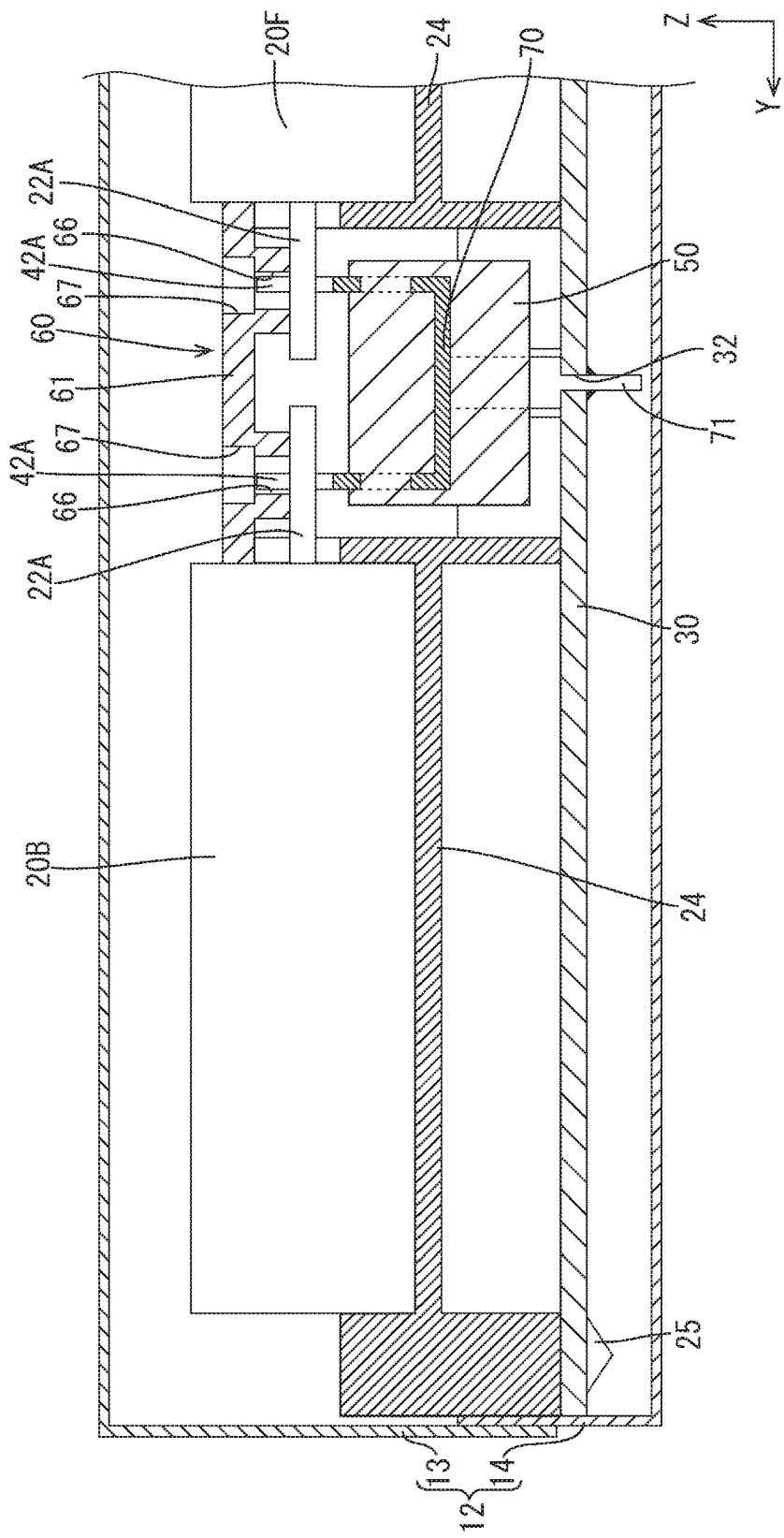
FIG. 8 is a YZ plane cross-sectional view of an auxiliary power supply device according to Embodiment 2.
Figure 9:
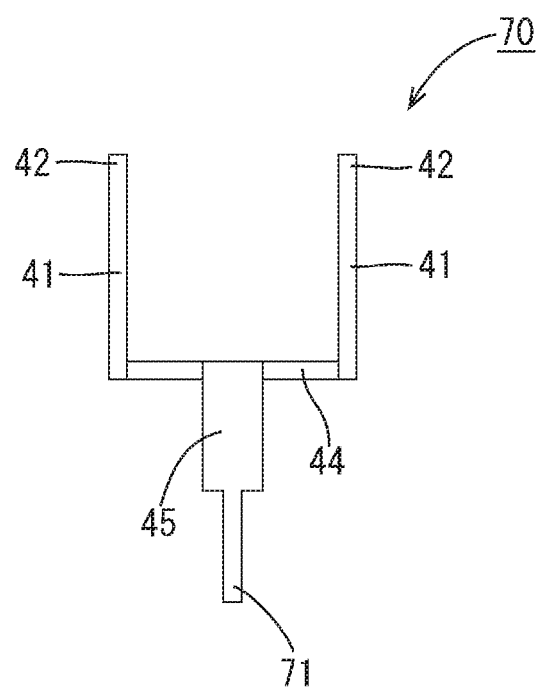
FIG. 9 is a front view showing a relay terminal.
Figure 10:
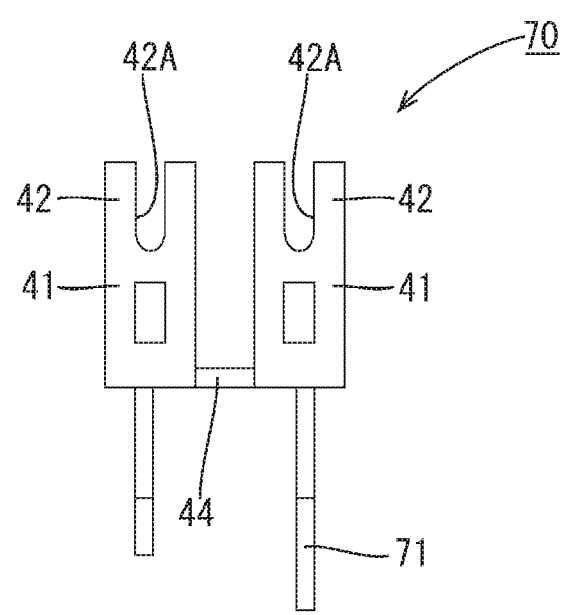
FIG. 10 is a side view showing the relay terminal.

Next, Embodiment 2 will be described with reference to FIGS. 8 to 10. In the board connection portions 45 of the relay terminals 40A and 40B according to Embodiment 1, the contact portions 46 are bent in an L-shape. However, a board connection portion 71 of a relay terminal 70 according to Embodiment 2 is inserted through a through hole 32 of the circuit board 30, and then soldered. In the following, the same components as those of Embodiment 1 are denoted by the same reference numerals, and the illustration thereof has been omitted.

The circuit board 30 has a plurality of through holes 32 extending therethrough so as to correspond to the positions of the board connection portions 45. As shown in FIGS. 9 and 10, the board connection portion 71 of the relay terminal 70 extends linearly downward. A relay terminal 70 held by the holder 50 is connected to the conductive path of the circuit board 30, for example, through flow soldering, in a state in which the board connection portion 71 is inserted into a through hole 32 of the circuit board 30.

Embodiment 3

Figure 11:
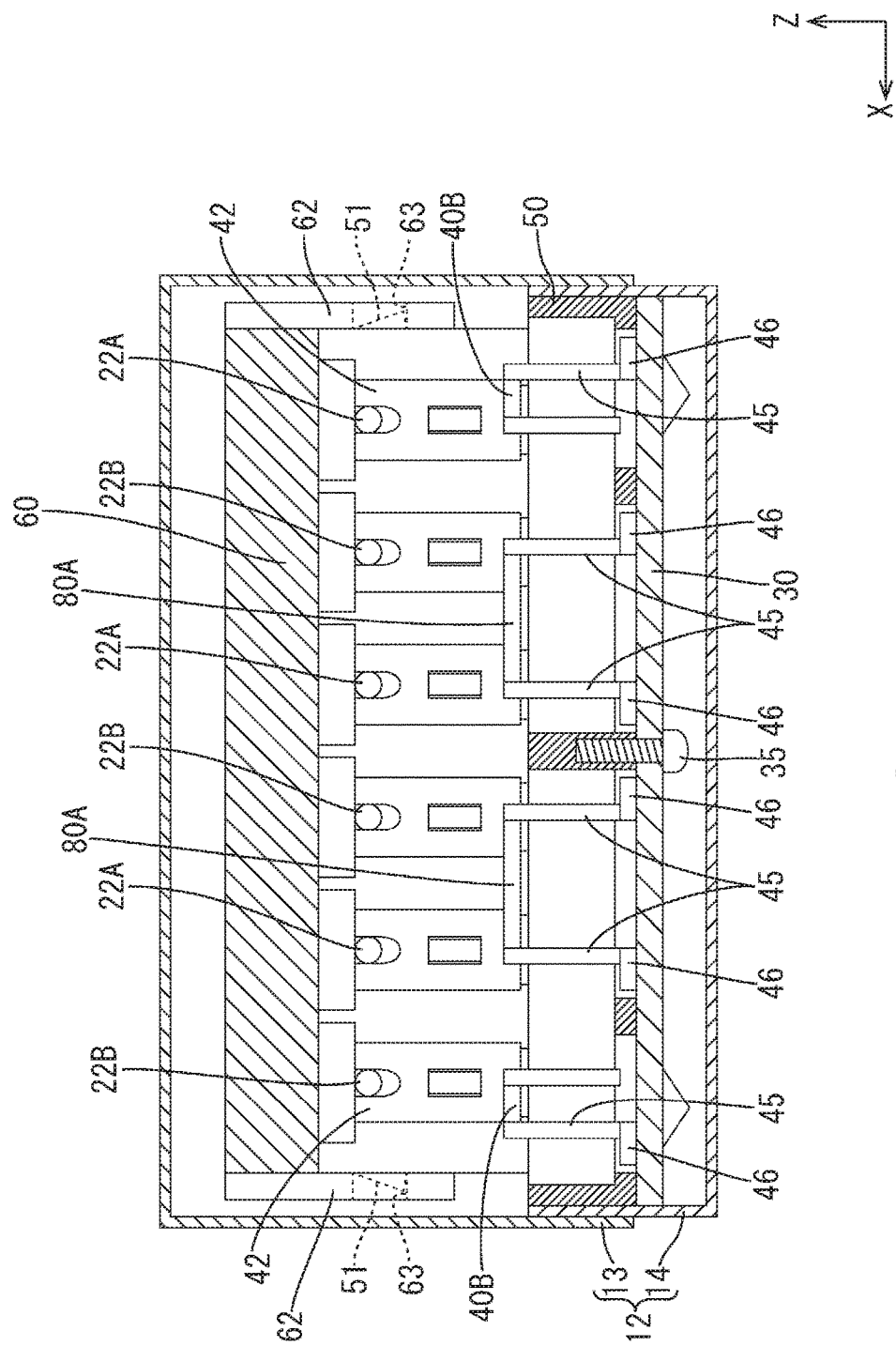
FIG. 11 is an XZ plane cross-sectional view of an auxiliary power supply device according to Embodiment 3.
Figure 12:
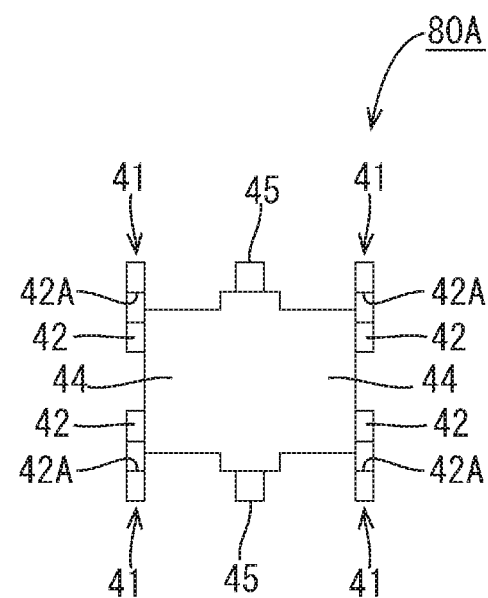
FIG. 12 is a plan view showing a relay terminal.
Figure 13:
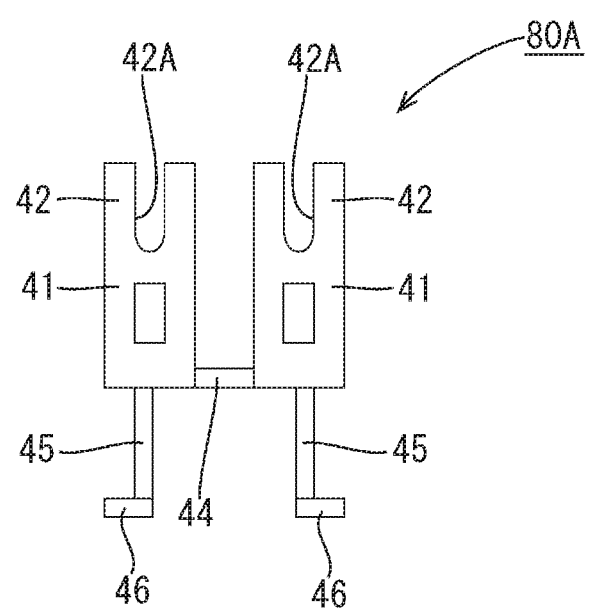
FIG. 13 is a front view showing the relay terminal.

Next, Embodiment 3 will be described with reference to FIGS. 11 to 14. In Embodiment 1, the relay terminal 40A includes one board connection portion 45. However, in Embodiment 3, each relay terminal 80A is provided with two board connection portions 45 as shown in FIG. 11. Note that, in an auxiliary power supply device 82 according to Embodiment 3, capacitors 20A to 20C, and 20E to 20G arranged in two rows each including three capacitors are connected in series-parallel. In the following, the same components as those of the above described embodiments are denoted by the same reference numerals, and the illustration thereof has been omitted. The contact portion 46 of each board connection portion 45 of each relay terminal 80A is connected to the conductive path on the surface of the circuit board 30 through reflow soldering, for example.

Figure 14:
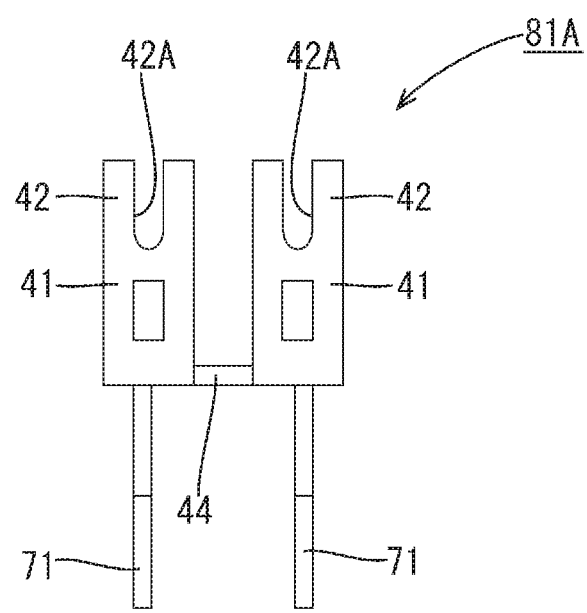
FIG. 14 is a side view showing the relay terminal.

As shown in FIG. 14, two (a plurality of) linear board connection portions 71 may be provided for each relay terminal 81A, and the board connection portions 71 may be inserted through the through holes 32 of the circuit board 30 and then be connected by flow soldering.

With a configuration as shown in Embodiment 3, the number of locations connected to the circuit board 30 can be reduced as compared with the configuration in which the lead terminals 22A and 22B are separately connected to the circuit board 30.

Embodiment 4

Figure 15:
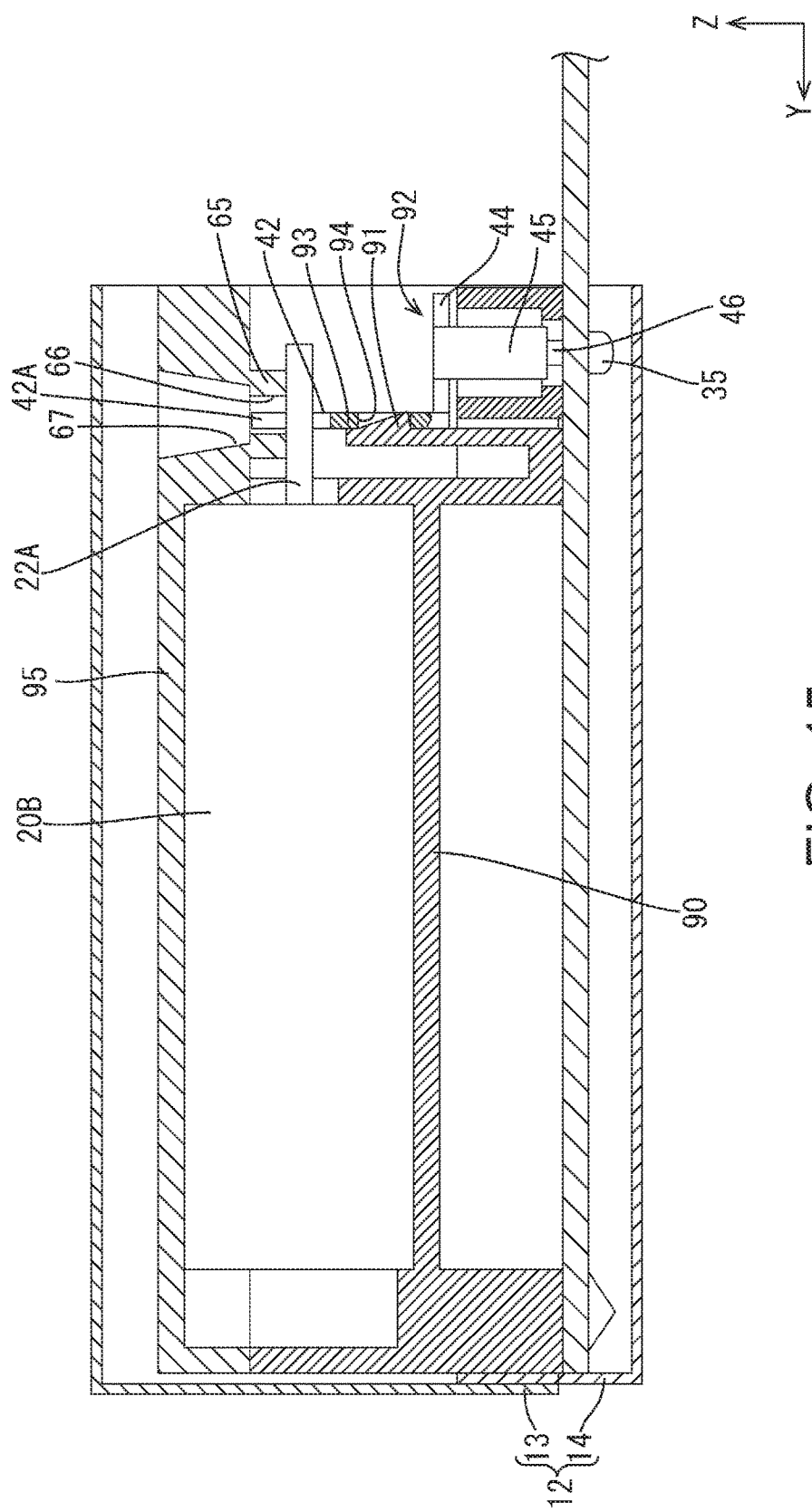
FIG. 15 is a YZ plane cross-sectional view of an auxiliary power supply device according to Embodiment 4.

Next, Embodiment 4 will be described with reference to FIG. 15. In Embodiment 4, a terminal locking portion 91 that is locked to the relay terminals 40A and 40B is formed in a capacitor holder 90 that holds the capacitors 20A to 20H. In the following, the same components as those of the above described embodiments are denoted by the same reference numerals, and the illustration thereof has been omitted. A rectangular locking hole 94 is formed extending through a connection piece 93 on which the pressure contact portion 42 of a relay terminal 92 is formed.

The terminal locking portion 91, which is capable of undergoing bending deformation, stands upward from a proximal end side that is in contact with the circuit board 30, and a locking pawl at its distal end is locked to an edge of the locking hole 94, thereby inhibiting the removal of the relay terminal 92 from a predetermined position. A cover 95 made of an insulating synthetic resin is attached on the upper side, and the cover 95 covers not only the lead terminals 22A and 22B and the relay terminals 40A and 40B, but also the capacitors 20A to 20H. The diameter of a viewing hole 67 that is formed extending through the cover 95 increases in an inclined manner upwards.

Other Embodiments

The technique described herein is not limited to the embodiments described and illustrated above. For example, the following embodiments are also included in the technical scope of the present disclosure.

(1) The number of capacitors 20A to 20H is not limited to those described in the above embodiments, and may be another number.

(2) Although the relay terminals 40A and 40B are configured to connect the capacitors 20A to 20H in series-parallel or in parallel, the relay terminals 40A and 40B may be configured to connect the capacitors 20A to 20H only in series (not in parallel).

(3) The numbers of pressure contact portions 42 and board connection portions 45 are not limited to those described in the above embodiments, and the number of board connection portions in at least one relay terminal may be smaller than the number of pressure contact portions 42.

The invention claimed is:

1. A power supply device comprising:
a plurality of capacitors including a plurality of lead terminals;
a circuit board including a conductive path;
a relay terminal configured to connect the lead terminals to the conductive path of the circuit board; and
a cover configured to cover the lead terminals, wherein the relay terminal includes plurality of pressure contacts configured to come into pressure contact with a plurality of lead terminals of the plurality of capacitors, the lead terminals having the same potential, and a substrate connector configured to be connected to the conductive path of the circuit board, a number of the substrate connectors being smaller than a number of the plurality of pressure contacts, and
a viewing hole that allows the pressure contact to be viewed from outside is formed extending through the cover.

* * * * *